(12) United States Patent
Ju et al.

(10) Patent No.: US 12,315,699 B2
(45) Date of Patent: May 27, 2025

(54) SUBSTRATE TREATING APPARATUS AND SUBSTRATE TREATING METHOD

(71) Applicant: SEMES CO., LTD., Cheonan-si (KR)

(72) Inventors: Yoon Jong Ju, Hwaseong-si (KR); Seong Gil Lee, Hwaseong-si (KR); Jae Hwan Kim, Gwangmyeong-si (KR); Wan Jae Park, Hwaseong-si (KR); Hye Joon Kheel, Hwaseong-si (KR); Ji Hoon Park, Suwon-si (KR); Young Je Um, Busan (KR)

(73) Assignee: SEMES CO., LTD., Chungcheongnam-do (KR)

( * ) Notice: Subject to any disclaimer, the term of this patent is extended or adjusted under 35 U.S.C. 154(b) by 261 days.

(21) Appl. No.: 17/854,653

(22) Filed: Jun. 30, 2022

(65) Prior Publication Data
US 2023/0207275 A1    Jun. 29, 2023

(30) Foreign Application Priority Data
Dec. 28, 2021    (KR) .................. 10-2021-0189911

(51) Int. Cl.
*H01J 37/32*    (2006.01)
*H01L 21/311*    (2006.01)

(52) U.S. Cl.
CPC .. *H01J 37/32449* (2013.01); *H01J 37/32422* (2013.01); *H01L 21/31116* (2013.01); *H01J 2237/334* (2013.01)

(58) Field of Classification Search
CPC .......... H01J 37/32449; H01J 37/32422; H01J 2237/334; H01J 37/32091; H01J 37/32357; H01J 37/3244; H01L 21/31116

USPC .......................................................... 216/67
See application file for complete search history.

(56) References Cited

U.S. PATENT DOCUMENTS

| | | | |
|---|---|---|---|
| 2006/0057804 A1* | 3/2006 | Saito ............... | H01L 21/308 438/254 |
| 2011/0240600 A1* | 10/2011 | Tajima ............ | H01L 21/02046 216/73 |
| 2017/0229309 A1* | 8/2017 | Huang ............ | H01J 37/32357 |
| 2018/0166303 A1* | 6/2018 | Tabata ............ | H01J 37/32137 |

FOREIGN PATENT DOCUMENTS

| | | |
|---|---|---|
| JP | 04-206719 A | 7/1992 |
| JP | 2018-098480 A | 6/2018 |
| JP | 2021-530876 A | 11/2021 |
| JP | 2022-181197 A | 12/2022 |
| JP | 2023-016719 A | 2/2023 |

(Continued)

OTHER PUBLICATIONS

Japanese Office Action, dated Aug. 22, 2023, issued in corresponding Japanese Patent Application No. 2022-155604.

(Continued)

*Primary Examiner* — Duy Vu N Deo
(74) *Attorney, Agent, or Firm* — Harness, Dickey & Pierce, P.L.C.

(57) ABSTRACT

The present invention provides a substrate treating method, including: a first treatment operation of treating the substrate by using first plasma generated by exciting first gas; and a second treatment operation of treating the substrate by using second plasma generated by exciting second gas different from the first gas.

13 Claims, 9 Drawing Sheets

(56) References Cited

FOREIGN PATENT DOCUMENTS

| | | |
|---|---|---|
| JP | 2023-016733 A | 2/2023 |
| JP | 2023-070001 A | 5/2023 |
| KR | 10-2003-0049086 A | 6/2003 |
| KR | 10-0847786 | 7/2008 |
| KR | 102107256 B1 | 5/2020 |
| KR | 10-2021-0006985 A | 1/2021 |
| WO | 2019/225184 A1 | 11/2019 |

OTHER PUBLICATIONS

Office Action for Korean Application No. 10-2021-0189911 dated Feb. 20, 2024.
Japanese Notice of Allowance dated Aug. 13, 2024 issued in Japanese Patent No. 2022-155604.

\* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0189911 filed in the Korean Intellectual Property Office on Dec. 28, 2021, the entire contents of which are incorporated herein by reference.

TECHNICAL FIELD

The present invention relates to a substrate treating apparatus and a substrate treating method, and more particularly, to a substrate treating apparatus and a substrate treating method, which treat a substrate with plasma.

BACKGROUND ART

Plasma refers to an ionized gas state composed of ions, radicals, and electrons. Plasma is generated by very high temperatures, strong electric fields, or RF Electromagnetic Fields. A semiconductor device manufacturing process may include an etching process of removing a thin film or a foreign material formed on a substrate, such as a wafer, by using plasma. The etching process is performed in which ions and/or radicals of plasma collide with the thin film on the substrate or react with the thin film.

In general, various films including a natural oxide film are stacked and formed on the substrate. Various processes for treating the substrate by using plasma require appropriate selectivity for each process. The selectivity is determined according to the degree of etching of the films formed on the substrate. Among the films formed on the substrate, a specific film may be etched by an etchant generated by reacting radicals (or plasma) and treatment gas with each other. In order to etch a specific film by the etchant, it needs to be premised that the etchant smoothly acts on the specific film. When the etchant does not smoothly act on the specific film, the etch rate for etching the specific film formed on the substrate decreases. When the etch rate of the etch target is lowered, the selectivity required for substrate treatment is not satisfied, resulting in a decrease in the yield of the process treatment.

SUMMARY OF THE INVENTION

The present invention has been made in an effort to provide a substrate treating apparatus and a substrate treating method, which are capable of efficiently treating a substrate.

The present invention has also been made in an effort to provide a substrate treating apparatus and a substrate treating method, which are capable of efficiently adjusting selectivity of a substrate required for each process.

The present invention has also been made in an effort to provide a substrate treating apparatus and a substrate treating method, which are capable of efficiently etching a specific film formed on a substrate.

The problem to be solved by the present invention is not limited to the above-mentioned problems, and the problems not mentioned will be clearly understood by those skilled in the art from the descriptions below.

An exemplary embodiment of the present invention provides a substrate treating method, including: a first treatment operation of treating the substrate by using first plasma generated by exciting first gas; and a second treatment operation of treating the substrate by using second plasma generated by exciting second gas different from the first gas.

According to the exemplary embodiment, the second treatment operation may be performed after the first treatment operation.

According to the exemplary embodiment, the first treatment operation and the second treatment operation may be alternately performed.

According to the exemplary embodiment, the first gas excited into the first plasma may contain hydrogen, and the second gas excited into the second plasma may contain fluorine.

According to the exemplary embodiment, the first gas may contain ammonia ($NH_3$), and the second gas may contain nitrogen trifluoride ($NF_3$).

According to the exemplary embodiment, in the first treatment operation, the first plasma may be generated in a first space within a chamber, ions included in the first plasma may be removed and an ammonia radical may be supplied to the second space while the first plasma flows from the first space to a second space located below the first space, and the ammonia radical may be supplied to a third space on which the substrate is placed.

According to the exemplary embodiment, in the first treatment operation, the first plasma may be generated in a first space within a chamber, ions included in the first plasma may be removed and an ammonia radical may be supplied to the second space while the first plasma flows from the first space to a second space located below the first space, and in the second space, the ammonia radical and third gas containing hydrogen may react to generate a first etchant, and the first etchant may be supplied to a third space in which the substrate is placed.

According to the exemplary embodiment, in the second treatment operation, the second plasma may be generated in the first space, ions included in the second plasma may be blocked and a fluorine radical is supplied to the second space while the second plasma flows from the first space to the second space, in the second space, the fluorine radical and third gas containing hydrogen may react to generate a second etchant, and the second etchant may be supplied to a third space in which the substrate is placed.

Another exemplary embodiment of the present invention provides a substrate treating method of treating a substrate in a chamber divided into a first space, a second space, and a third space, the substrate treating method including: generating plasma by supplying process gas in the first space, and generating an etchant by reacting the plasma and treatment gas in the second space located below the first space, in which the etchant treats the substrate in the third space located below the second space, the process gas includes first gas and second gas different from the first gas, a quality of a film formed on the substrate is improved by supplying the first gas to the first space and generating first plasma, and the film formed on the substrate is removed by supplying the second gas to the first space and generating second plasma.

According to the exemplary embodiment, the first gas and the second gas may be alternately supplied to the first space.

According to the exemplary embodiment, the first gas may contain ammonia ($NH_3$), and the second gas may contain nitrogen trifluoride ($NF_3$).

According to the exemplary embodiment, the first space and the second space may be partitioned by a grounded plate, ions included in the first plasma generated by the first gas supplied to the first space may be blocked by the plate, so that an ammonia radical may be supplied to the second space, and ions included in the second plasma generated by the second gas supplied to the first space may be blocked by the plate, so that a fluorine radical may be supplied to the second space.

According to the exemplary embodiment, the treatment gas may include ammonia ($NH_3$).

According to the exemplary embodiment, the treatment gas may be continuously supplied to the second space while the first gas and/or the second gas is supplied to the first space.

According to the exemplary embodiment, the first gas and the second gas may be simultaneously supplied to the first space.

Another exemplary embodiment of the present invention provides a substrate treating apparatus, including: a chamber having an inner space; a support unit for supporting a substrate in the inner space; an upper electrode to which high-frequency power is applied; an ion blocker disposed under the upper electrode and grounded; a shower head disposed under the ion blocker and above the support unit, and formed with a plurality of through holes; a process gas supply unit for supplying process gas including first gas and second gas different from the first gas to a space between the upper electrode and the ion blocker; a treatment gas supply unit for supplying treatment gas to a space between the ion blocker and the shower head; and a controller, in which the controller controls the upper electrode and the process gas supply unit so as to generate first plasma in a plasma generating space by supplying the first gas to a region between the upper electrode and the ion blocker defined as the plasma generating space, and generate second plasma in the plasma generating space by supplying second gas to the plasma generating space.

According to the exemplary embodiment, the controller may control the process gas supply unit so as to supply the first gas to the plasma generating space and supply the second gas to the plasma generating space after a set time has elapsed.

According to the exemplary embodiment, the controller may control the process gas supply unit so that the first gas and the second gas are alternately supplied to the plasma generating space.

According to the exemplary embodiment, the controller may control the treatment gas supply unit so that the treatment gas is continuously supplied to a mixing space defined by a region between the ion blocker and the shower head while the first gas or the second gas is supplied to the plasma generating space.

According to the exemplary embodiment, the first gas may contain ammonia ($NH_3$), and the second gas may contain nitrogen trifluoride ($NF_3$).

According to the exemplary embodiment of the present invention, it is possible to efficiently treat the substrate.

Further, according to the exemplary embodiment of the present invention, it is possible to efficiently adjust selectivity of a substrate required for each process.

Further, according to the exemplary embodiment of the present invention, it is possible to efficiently etch a specific film formed on a substrate.

The effect of the present invention is not limited to the foregoing effects, and non-mentioned effects will be clearly understood by those skilled in the art from the present specification and the accompanying drawings.

DETAILED DESCRIPTION

Figure 1:
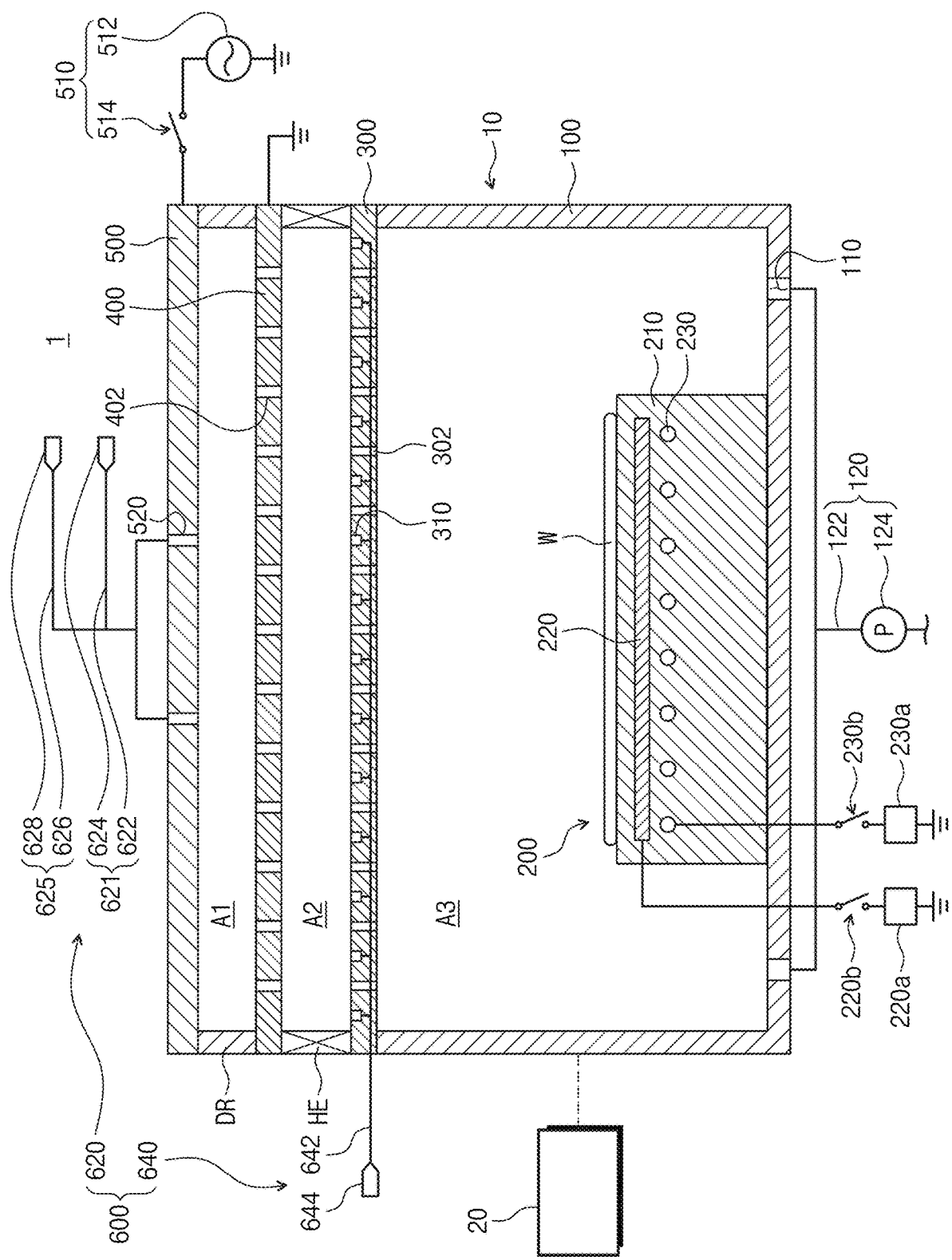
FIG. 1 is a diagram schematically illustrating a substrate treating apparatus according to an exemplary embodiment of the present invention.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Hereinafter, an exemplary embodiment of the present invention will be described in detail with reference to FIGS. 1 to 10.

FIG. 1 is a diagram schematically illustrating a substrate treating apparatus according to an exemplary embodiment of the present invention. Referring to FIG. 1, a substrate treating apparatus 1 according to the exemplary embodiment of the present invention treats a substrate W. The substrate treating apparatus 1 may treat the substrate W by using plasma. For example, the substrate treating apparatus 1 may perform an etching process for removing a thin film on the substrate W by using plasma, an ashing process for removing a photoresist film, a deposition process for forming a thin film on the substrate W, or a dry cleaning process. However, the present invention is not limited thereto, and the plasma treatment process performed by the substrate treating apparatus 1 may be variously modified into a known plasma treatment process. As the substrate W loaded into the substrate treating apparatus 1, the substrate W on which the treatment process has been partially performed may be loaded. For example, the substrate W loaded into the substrate treating apparatus 1 may be a substrate W on which an etching process or a photo process has been performed.

The substrate treating apparatus 1 may include a controller 20, a housing 100, a support unit 200, a shower head 300, an ion blocker 400, an upper electrode 500, and a gas supply unit 600.

The chamber 10 may have an inner space. The inner space of the chamber 10 may be divided into a first space A1, a second space A2, and a third space A3. The chamber 10 may be collectively defined by components involved in defining the first space A1, the second space A2, and the third space A3.

The first space A1 and the second space A2 may be partitioned by the ion blocker 400 to be described later. The first space A1 is provided above the ion blocker 400, and the second space A2 is provided under the ion blocker 400. The second space A2 and the third space A3 may be partitioned by the shower head 300 to be described later. The second space A2 is provided above the shower head 300, and the third space A3 is provided under the shower head 300. The third space A3, the second space A2, and the first space A1 may be sequentially provided in an upward direction from the bottom of an inner space of the chamber 10.

The first space A1 may be defined as a space in which the upper electrode 500 and the ion blocker 400, which will be described later, are combined with each other. The first space A1 may be provided as a space in which the plasma P is generated. Accordingly, the first space A1 may function as a plasma generating space.

The second space A2 may be defined as a space formed by combining the ion blocker 400 and the shower head 300 with each other. The second space A2 is provided as a space in which the radicals R included in the plasma P generated in the first space A1 and the third gas G3 to be described later react with each other to form an etchant E. Accordingly, the second space A2 may function as a mixing space.

The third space A3 may be defined as a space formed by combining the shower head 300 and the housing 100 to be described later. A support unit 200 to be described later is disposed in the third space A3. The third space A3 may function as a treatment space in which the substrate W supported by the support unit 200 is treated. In the third space A3, the substrate W may be treated by the radicals R and/or the etchants E.

The controller 20 may control the substrate treating apparatus 1. The controller 20 may include a process controller formed of a microprocessor (computer) that executes the control of the substrate treating apparatus 1, a user interface formed of a keyboard in which an operator performs a command input operation or the like in order to manage the substrate treating apparatus 1, a display for visualizing and displaying an operation situation of the substrate treating apparatus 1, and the like, and a storage unit storing a control program for executing the process executed in the substrate treating apparatus 1 under the control of the process controller or a program, that is, a treatment recipe, for executing the process in each component according to various data and treatment conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 20 may control the substrate treating apparatus 1 so as to perform a substrate treating method described below. For example, the controller 20 may control components provided in the substrate treating apparatus 1 s as to perform the substrate treating method described below.

The housing 100 may define the third space A3. For example, the housing 100 may be combined with the shower head 300 to be described later to define the third space A3. The support unit 200 to be described later is disposed in the third space A3 defined by the housing 100. The housing 100 may be provided in a generally cylindrical shape. For example, the housing 100 may have a cylindrical shape with an open top.

An inner wall of the housing 100 may be coated with a material that is capable of preventing etching by the plasma P. For example, the inner wall of the housing 100 may be coated with a dielectric film, such as ceramic. The housing 100 may be grounded. An opening (not illustrated) through which the substrate W is loaded from the third space A3 or the substrate W is loaded into the third space A3 may be formed in the housing 100. The opening (not illustrated) may be selectively opened/closed by a door (not illustrated).

An exhaust hole 110 is formed in the bottom surface of the housing 100. The exhaust hole 110 may be connected to an exhaust unit 120. The exhaust unit 120 discharges particles, process by-products, and the like that flow in the third space A3. The exhaust unit 120 may adjust the pressure of the third space A3. The exhaust unit 120 may include an exhaust line 122 and a decompression member 124. One end of the exhaust line 122 may be connected to the exhaust hole 110, and the other end of the exhaust line 122 may be connected to the decompression member 124. The decompression member 124 may be a pump. However, the present invention is not limited thereto, and the decompression member 124 may be variously modified and provided with a known device for providing a negative pressure to the third space A3.

The support unit 200 is located inside the third space A3. The support unit 200 supports the substrate W in the third space A3. The support unit 200 may be an ESC capable of chucking the substrate W using electrostatic force. The support unit 200 may heat the supported substrate W.

The support unit 200 may include a body 210, an electrostatic electrode 220, and a heater 230. The body 210 supports the substrate W. The body 210 has a support surface for supporting the substrate W on the upper surface. The A substrate W is seated on the upper surface of the body 210. The body 210 may be provided with a dielectric substance. The body 210 may be provided as a disk-shaped dielectric plate. For example, the body 210 may be made of a ceramic material. The electrostatic electrode 220 and the heater 230, which will be described later, may be embedded in the body 210.

The electrostatic electrode 220 may be provided at a position overlapping the substrate W when viewed from the top. The electrostatic electrode 220 may be disposed above the heater 230. The electrostatic electrode 220 is electrically connected to a first power source 220a. The first power source 220a may include a DC power source. A first switch 220b is installed between the electrostatic electrode 220 and the first power source 220a. The electrostatic electrode 220 may be electrically connected to the first power source 220a by turning on/off the first switch 220b. For example, when the first switch 220b is turned on, a direct current is applied to the electrostatic electrode 220. When a current is applied to the electrostatic electrode 220, an electric field by electrostatic force capable of chucking the substrate W may be formed in the electrostatic electrode 220. The electric field may transmit attractive force by which the substrate W is chucked in a direction toward the body 210 to the substrate W. Accordingly, the substrate W is adsorbed to the body 210.

The heater 230 heats the substrate W. The heater 230 may heat the substrate W supported on the upper surface of the body 210. The heater 230 heats the substrate W by increasing the temperature of the body 210. The heater 230 is electrically connected to the second power source 230a. A second switch 230b is installed between the heater 230 and the second power source 230a. The heater 230 may be electrically connected to the second power source 230a by turning on/off the second switch 230b. The heater 230 generates heat by resisting the current applied from the second power source 230a.

The generated heat is transferred to the substrate W through the body 210. The substrate W may be maintained at a temperature required for the process by the heat generated by the heater 230. In addition, the heater 230 increase the temperature of the body 210 to prevent impurities (for example, an oxide film) separated from the substrate W from re-adhering to the substrate W while the substrate W is treated. The heater 230 may be a heating element, such as tungsten. However, the type of the heater 230 is not limited thereto, and the heater may be variously modified and provided with known heating elements.

Although not illustrated, according to the exemplary embodiment, a plurality of heaters 230 may be provided as spiral coils. The heaters 230 may be provided in different regions of the body 210, respectively. For example, the heater 230 for heating a central region of the body 210 and the heater 230 for heating an edge region of the body 210 may be provided, and the heaters 230 may independently adjust the degree of heating from each other.

In the above-described example, it has been described that the heater 230 is provided in the body 210 as an example, but the present invention is not limited thereto. For example, the heater 230 may not be provided in the body 210.

The shower head 300 may be disposed on the housing 100. The shower head 300 may be disposed between the ion blocker 400 and the third space A3 to be described later. A space formed by combining the shower head 300 and the housing 100 may be defined as the third space A3. In addition, the space formed by combining the shower head 300 and the ion blocker 400 to be described later may be defined as the second space A2.

The shower head 300 may be formed in a generally circular shape when viewed from the top. For example, the shower head 300 may be provided in a disk shape. According to the exemplary embodiment, the shower head 300 may be made of a material of stainless steel.

A through hole 302 may be formed in the shower head 300. A plurality of through holes 302 may be provided. The plurality of through holes 302 may be formed to extend from an upper surface to a lower surface of the shower head 300. That is, the plurality of through holes 302 may be formed through the shower head 300. The plurality of through holes 302 may function as passages for fluid communication between the second space A2 and the third space A3. For example, the plurality of through holes 302 may allow the fluid flowing in the upper second space A2 to flow into the lower third space A3.

A lower gas inlet 310 may be formed in the shower head 300. At least one lower gas inlet 310 may be provided. The lower gas inlet 310 may be connected to a treatment gas line 642 to be described later. The lower gas inlet 310 may communicate with the second space A2. The lower gas inlet 310 may supply the third gas G3 to be described later toward the second space A2. The lower gas inlet 310 may communicate with the second space A2, but may be configured not to communicate with the third space A3. The lower gas inlet 310 may be disposed between the plurality of through holes 302. That is, the lower gas inlet 310 may be formed at a position that does not overlap the plurality of through holes 302.

A heating member HE may be disposed above the shower head 300. The heating member HE may be a heater having a ring shape when viewed from the top. The heating member HE may increase the temperature of the second space A2. The heating member HE generates heat to increase the temperature of the second space A2 to increase the mixing efficiency of the plasma P from which ions are removed and the third gas G3.

The ion blocker 400 may be disposed above the shower head 300. In addition, the ion blocker 400 may be disposed above the heating member HE. The ion blocker 400 may be disposed between the shower head 300 and the upper electrode 500 to be described later. The ion blocker 400 may be divided into the upper first space A1 and the lower second space A2. For example, a space formed by combining the ion blocker 400, the upper electrode 500, and an insulating member DR to be described later may be defined as the first space A1. In addition, a space formed by combining the ion blocker 400, the shower head 300, and the heating member HE may be defined as the second space A2.

The ion blocker 400 may be grounded. The ion blocker 400 may function as an electrode opposite to the upper electrode 500 to be described later. Accordingly, the ion blocker 400 may function as a plasma source that generates the plasma P in the first space A1 together with the upper electrode 500.

A hole 402 may be formed in the ion blocker 400. The hole 402 may pass through an upper end and a lower end of the ion blocker 400. The plasma P generated in the first space A1 may flow from the first space A1 to the second space A2 through the hole 402. The ion blocker 400 may absorb ions (or electrons) and ions and electrons in the radicals R included in the plasma P passing through the hole 402. Accordingly, only the radical R among the components included in the plasma P may pass through the ion blocker 400. The ion blocker 400 may function to block the passage of ions.

The upper electrode 500 may have a plate shape. The upper electrode 500 may be located above the inner space of the chamber 10. The upper electrode 500 may be disposed above the ion blocker 400. The upper electrode 500 may be disposed to face the ion blocker 400. The insulating member DR made of as an insulating material may be disposed between the upper electrode 500 and the ion blocker 400. The insulating member DR may have a ring shape when viewed from the top. The insulating member DR may electrically insulate the ion blocker 400 and the upper electrode 500 from each other.

A power module 510 may be provided to the upper electrode 500. The power module 510 may apply power to the upper electrode 500. The power module 510 may include an upper power supply 512 and an upper power switch 514. The upper power supply 512 may be provided as an RF power supply. The upper power supply 512 may apply a high frequency current to the upper electrode 500. An impedance matcher (not illustrated) may be provided between the upper electrode 500 and the upper power source 512. A high-frequency current is applied to the upper electrode 500 according to the on/off of the upper power switch 514. When a high-frequency current is applied to the upper electrode 500, an electric field is formed between the ion blocker 400 functioning as the opposite electrode and the upper electrode 500. Accordingly, plasma may be generated by exciting the process gas (for example, the first gas G1 and/or the second gas G2) supplied to the first space A1.

An upper gas inlet 520 may be formed in the upper electrode 500. At least one upper gas inlet 520 may be provided. The upper gas inlet 520 may be connected to a first gas line 622 to be described later. The upper gas inlet 520 may supply process gas toward the first space A1.

The gas supply unit 600 supplies gas to the inner space of the chamber 10. For example, the gas supply unit 600 may supply process gas to the first space A1 and supply treatment gas to the second space A2. The gas supply unit 600 may include a process gas supply unit 620 and a treatment gas supply unit 640.

The process gas supply unit 620 supplies the process gas to the first space A1. The process gas supplied to the first space A1 may include the first gas G1 and/or the second gas G2. The first gas G1 and the second gas G2 supplied to the first space A1 may be alternately supplied. Optionally, the first gas G1 may be first supplied to the first space A1, and then the second gas G2 may be supplied to the first space A1. Also, the first gas G1 and the second gas G2 may be simultaneously supplied to the first space A1. The detailed mechanism for this will be described below.

The process gas supply unit 620 may include a first gas supply source 621 and a second gas supply source 625. The first gas supply source 621 supplies the first gas G1 to the first space A1. The first gas supply source 621 may supply the first gas G1 to the first space A1 that is a space between the upper electrode 500 and the ion blocker 400. The first gas supply source 621 may include the first gas line 622 and a first gas supply source 624.

The first gas line 622 connects the first gas supply source 624 and the upper gas inlet 520 to each other. One end of the first gas line 622 may be connected to each of the plurality of upper gas inlets 520, and the other end of the first gas line 622 may be connected to the first gas supply source 624.

The first gas supply source 624 supplies the first gas G1 to the first space A1 through the first gas line 622. The first gas G1 may include a hydrogen-based element. For example, the first gas G1 may be ammonia ($NH_3$) gas. Optionally, the first gas G1 may further include inert gas, such as $H_2$ or He. The inert gas included in the first gas G1 may function as carrier gas. The first gas G1 supplied to the first space A1 may be excited into the first plasma P1.

The second gas supply source 625 supplies the second gas G2 to the first space A1. The second gas supply source 625 may supply the second gas G2 to the first space A1 that is a space between the upper electrode 500 and the ion blocker 400. The second gas supply source 625 may include a second gas line 626 and a second gas supply source 628.

The second gas line 626 connects the second gas supply source 628 and the upper gas inlet 520 to each other. One end of the second gas line 626 may be connected to each of the plurality of upper gas inlets 520, and the other end of the second gas line 626 may be connected to the second gas supply source 628.

The second gas supply source 628 supplies the second gas G2 to the first space A1 through the second gas line 626. The second gas G2 may include a hydrogen-based element. For example, the second gas G2 may include a fluorine-based element. For example, the second gas G2 may be nitrogen trifluoride ($NF_3$) or fluorine ($F_2$) gas. Optionally, the second gas G2 may further include any one or a plurality of Ar, $H_2$, and He. The second gas G2 supplied to the first space A1 may be excited by the upper electrode 500 and the ion blocker 400 to generate second plasma P2.

The treatment gas supply unit 640 may supply the third gas G3 to the second space A2. The third gas G3 supplied to the second space A2 may be treatment gas that reacts with radicals. The treatment gas supply unit 640 may supply the third gas G3 to the second space A2 that is the space between the ion blocker 400 and the shower head 300. The treatment gas supply unit 640 may include the treatment gas line 642 and a treatment gas supply source 644.

The treatment gas line 642 connects the treatment gas supply source 644 and the lower gas inlet 310 to each other. One end of the treatment gas line 642 may be connected to each of the plurality of lower gas inlets 310, and the other end of the treatment gas line 642 may be connected to the treatment gas supply source 644.

The treatment gas supply source 644 supplies the third gas G3 as the treatment gas to the second space A2 through the treatment gas line 642. The third gas G3 may include a hydrogen-based element. For example, the third gas G3 may be ammonia ($NH_3$) gas. Optionally, the third gas G3 may further include inert gas, such as $H_2$ or He. The inert gas included in the third gas G3 may function as carrier gas. The third gas G3 supplied to the second space A2 may react with the radicals R to generate the etchant E.

Figure 2:
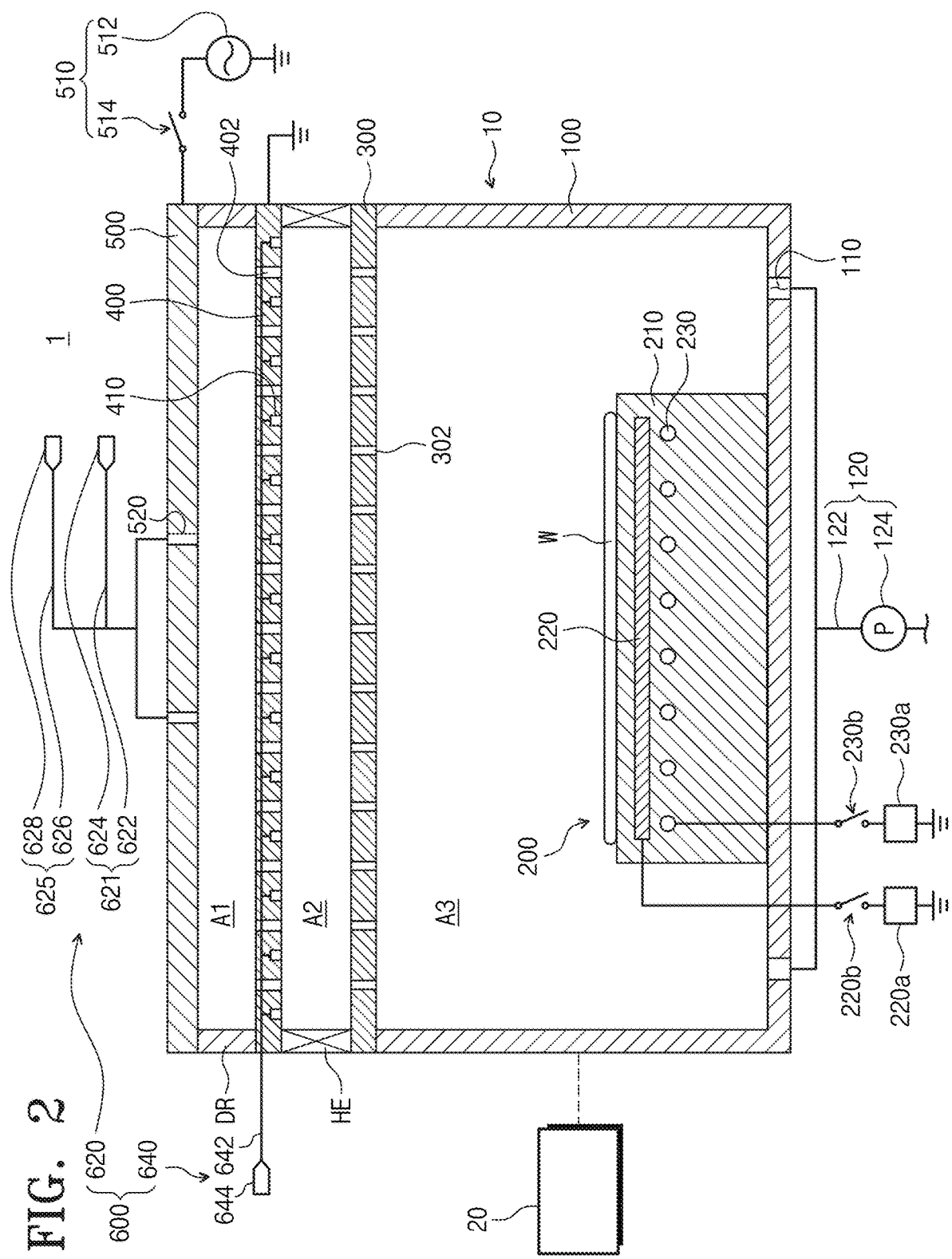
FIGS. 2 and 3 are diagrams schematically illustrating a substrate treating apparatus according to another exemplary embodiment of FIG. 1.
Figure 3:
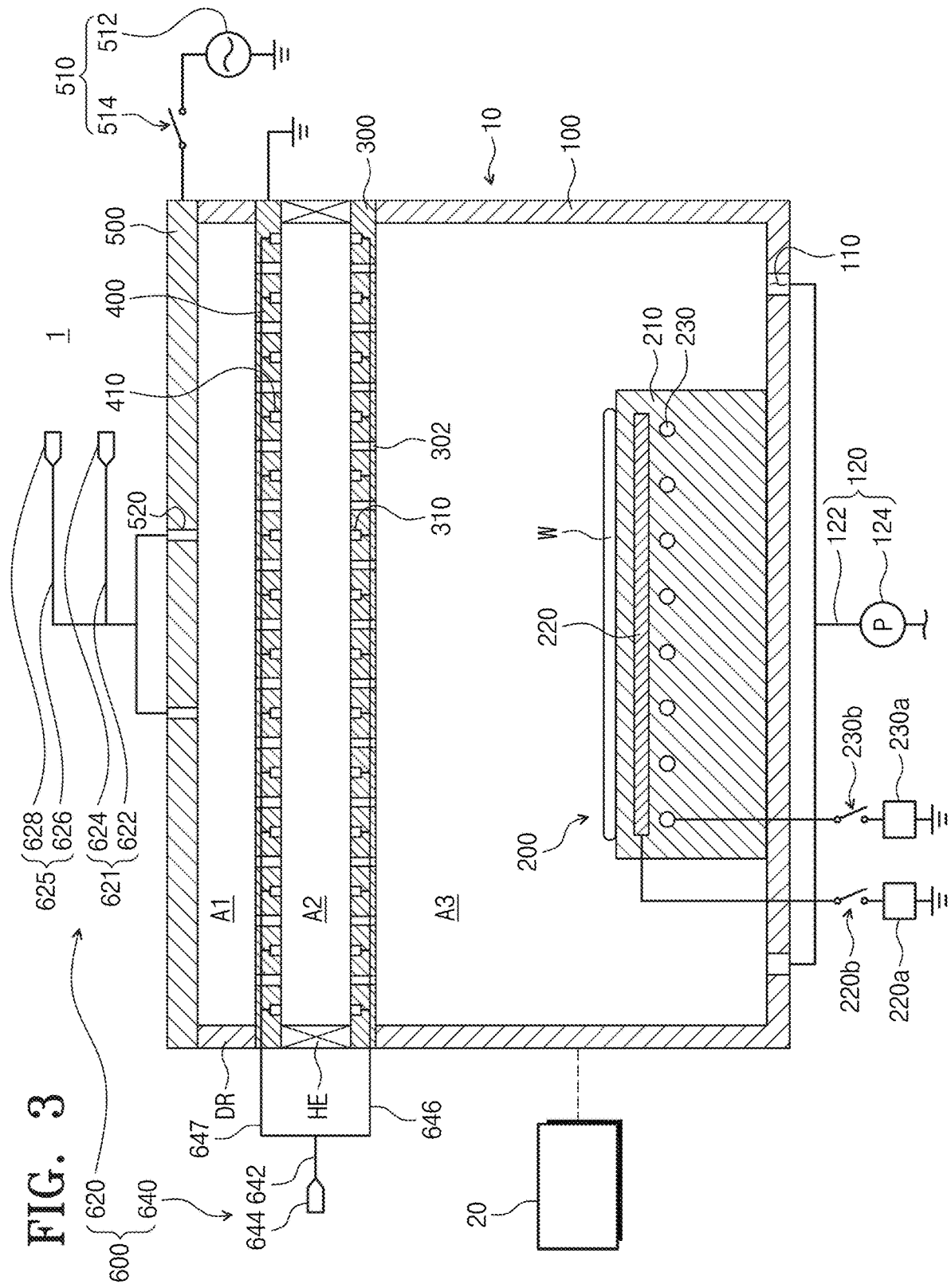

FIGS. 2 and 3 are diagrams schematically illustrating a substrate treating apparatus according to another exemplary embodiment of FIG. 1. The substrate treating apparatus according to the exemplary embodiment described below is provided in a substantially similar configuration to the substrate treating apparatus according to the exemplary embodiment described with reference to FIG. 1. Accordingly, descriptions of overlapping components will be omitted to prevent duplication of contents.

Referring to FIG. 2, a through hole 302 may be formed in a shower head 300. A plurality of through holes 302 may be provided. The plurality of through holes 302 may be formed to extend from an upper surface to a lower surface of the shower head 300. That is, the plurality of through holes 302 may be formed through the shower head 300. The plurality of through-holes 302 may communicate a fluid from an upper second space A2 to a lower third space A3.

A hole 402 and a central gas inlet 410 may be formed in the ion blocker 400. The hole 402 may pass through an upper end and a lower end of the ion blocker 400. At least one central gas inlet 410 may be provided. A plurality of central gas inlets 410 may be provided. Each of the plurality of central gas inlets 410 may be connected to a treatment gas line 642. The central gas inlet 410 may supply the third gas G3 toward the second space A2. The central gas inlet 410 may communicate with the second space A2, but may be configured not to communicate with the upper first space A1.

Referring to FIG. 3, the through hole 302 may be formed in the shower head 300. A plurality of through holes 302 may be provided. The plurality of through holes 302 may be formed to extend from an upper surface to a lower surface of the shower head 300. That is, the plurality of through holes 302 may be formed through the shower head 300. The plurality of through-holes 302 may communicate a fluid from an upper second space A2 to a lower third space A3.

A lower gas inlet 310 may be formed in the shower head 300. At least one lower gas inlet 310 may be provided. A plurality of lower gas inlets 310 may be provided. Each of the plurality of lower gas inlets 310 may be connected to a first branch line 646 to be described later. The lower gas inlet 310 may supply the third gas G3 toward the second space A2.

The lower gas inlet 310 may communicate with the second space A2, but may be configured not to communicate with the third space A3. The lower gas inlet 310 may be disposed between the plurality of through holes 302. That is, the lower gas inlet 310 may be formed at a position that does not overlap the plurality of through holes 302.

A hole 402 and a central gas inlet 410 may be formed in the ion blocker 400. The hole 402 may pass through an upper end and a lower end of the ion blocker 400. At least one central gas inlet 410 may be provided. A plurality of central gas inlets 410 may be provided. Each of the plurality of central gas inlets 410 may be connected to a second branch line 647 to be described later. The central gas inlet 410 may supply the third gas G3 toward the second space A2. The central gas inlet 410 may communicate with the second space A2, but may be configured not to communicate with the upper first space A1.

A treatment gas supply unit 640 may include a treatment gas line 642 and a treatment gas supply source 644. The treatment gas line 642 may include a main line 645, a first branch line 646, and a second branch line 647. One end of the main line 645 is connected to the treatment gas supply source 644 for supplying the third gas G3. The other end of the main line 645 may be branched into a first branch line 646 and a second branch line 647. The first branch line 646 may be connected to the lower gas inlet 310. The third gas G3 supplied to the lower gas inlet 310 through the main line 645 and the first branch line 646 may be supplied to the second space A2. The second branch line 647 may be connected to the central gas inlet 410. The third gas G3 supplied to the central gas inlet 410 through the main line 645 and the second branch line 647 may be supplied to the second space A2.

Unlike the above-described exemplary embodiment, the lower gas inlet 310 may be formed only in the edge region of the shower head 300. Also, the central gas inlet 410 may be formed only in the central region of the ion blocker 400.

Hereinafter, the substrate treating method according to the exemplary embodiment of the present invention will be described in detail. The substrate treating method described below may be performed in the substrate treating apparatus 1 according to the exemplary embodiment. Also, the controller 20 may control the configurations of the substrate treating apparatus 1 so that the substrate treating apparatus 1 is capable of performing the substrate treating method described below. The substrate treating method according to the exemplary embodiment to be described below will be described based on the case where the substrate treating method is performed by using the substrate treating apparatus 1 described with reference to FIG. 1 as an example. However, the present invention is not limited thereto, and the substrate treating method according to the exemplary embodiment of the present invention may be performed by using the substrate treating apparatus 1 of FIGS. 2 and 3.

Figure 4:
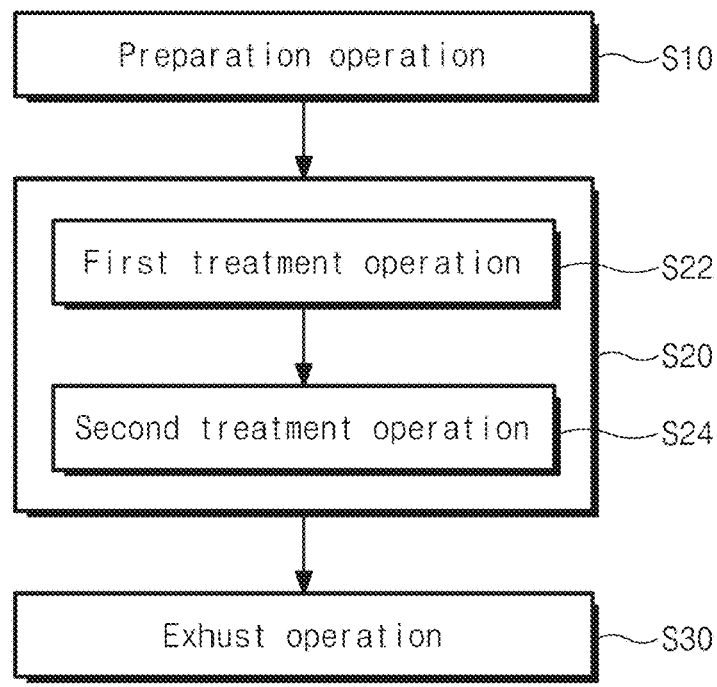
FIG. 4 is a flowchart illustrating a substrate treating method according to an exemplary embodiment of the present invention.

FIG. 4 is a flowchart illustrating the substrate treating method according to the exemplary embodiment of the present invention. Referring to FIG. 4, the substrate treating method according to the exemplary embodiment of the present invention may include a preparation operation S10, a treatment operation S20, and an exhaust step S30.

The preparation operation S10 may be an operation of preparing an atmosphere of the inner space of the chamber 10 into an environment suitable for treating the substrate W. For example, in the preparation operation S10, after the substrate W is loaded into the inner space of the chamber 10 using a transfer robot (not illustrated), the pressure in the inner space of the chamber 10 may be stabilized. In the preparation operation S10, an inner space atmosphere of the chamber 10 suitable for treating the substrate W may be formed using the exhaust unit 120. For example, the exhaust unit 120 may partially exhaust the atmosphere of the inner space of the chamber 10 to maintain the pressure of the inner space of the chamber 10 at a set pressure.

Optionally, in the preparation operation S10, the first gas supply source 621 and the second gas supply source 625 may supply inert gas, such as $H_2$ or He, to the first space A1. Also, in the preparation operation S10, the treatment gas supply unit 640 may supply inert gas, such as $H_2$ or He, to the second space A2. In addition, in the preparation operation S10, the configurations included in the substrate treating apparatus 1 may be checked by the controller 20.

In the above-described example, the case where after the substrate W is loaded into the inner space of the chamber 10, the preparation operation S10 is performed has been described as an example, but the present invention is not limited thereto. For example, the preparation operation S10 may be performed in a state in which the substrate W is not loaded into the inner space of the chamber 10. After the preparation operation S10 is completed, the substrate W may be loaded into the inner space of the chamber 10.

Figure 5:
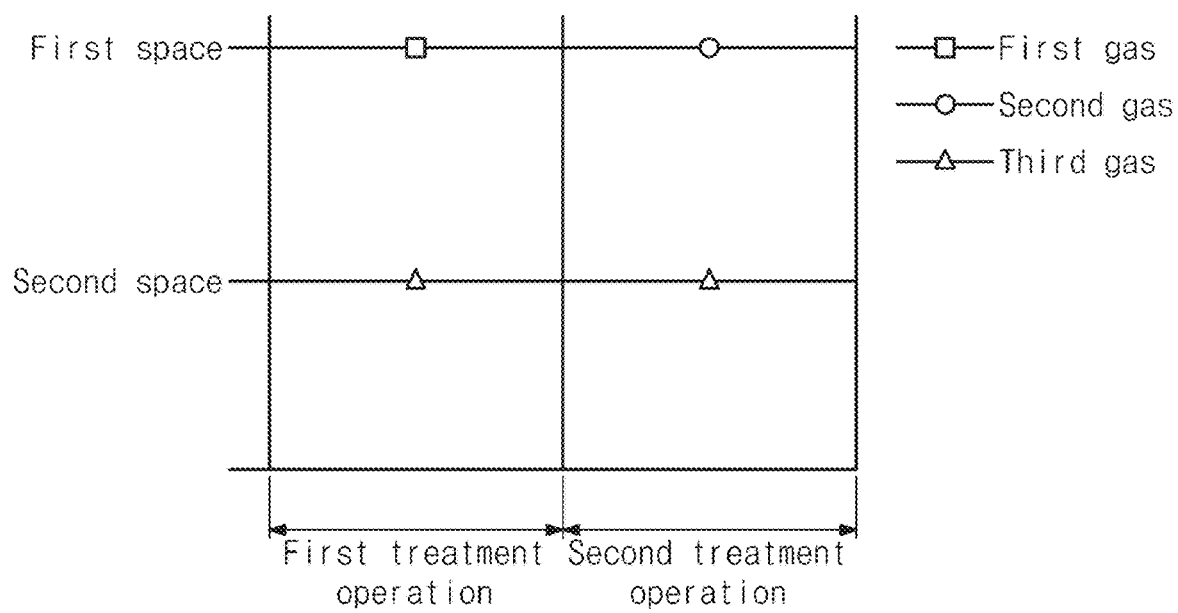
FIG. 5 is a diagram schematically illustrating types of gas supplied to a first space and a second space in a first treatment operation and a second treatment operation of FIG. 4.
Figure 6:
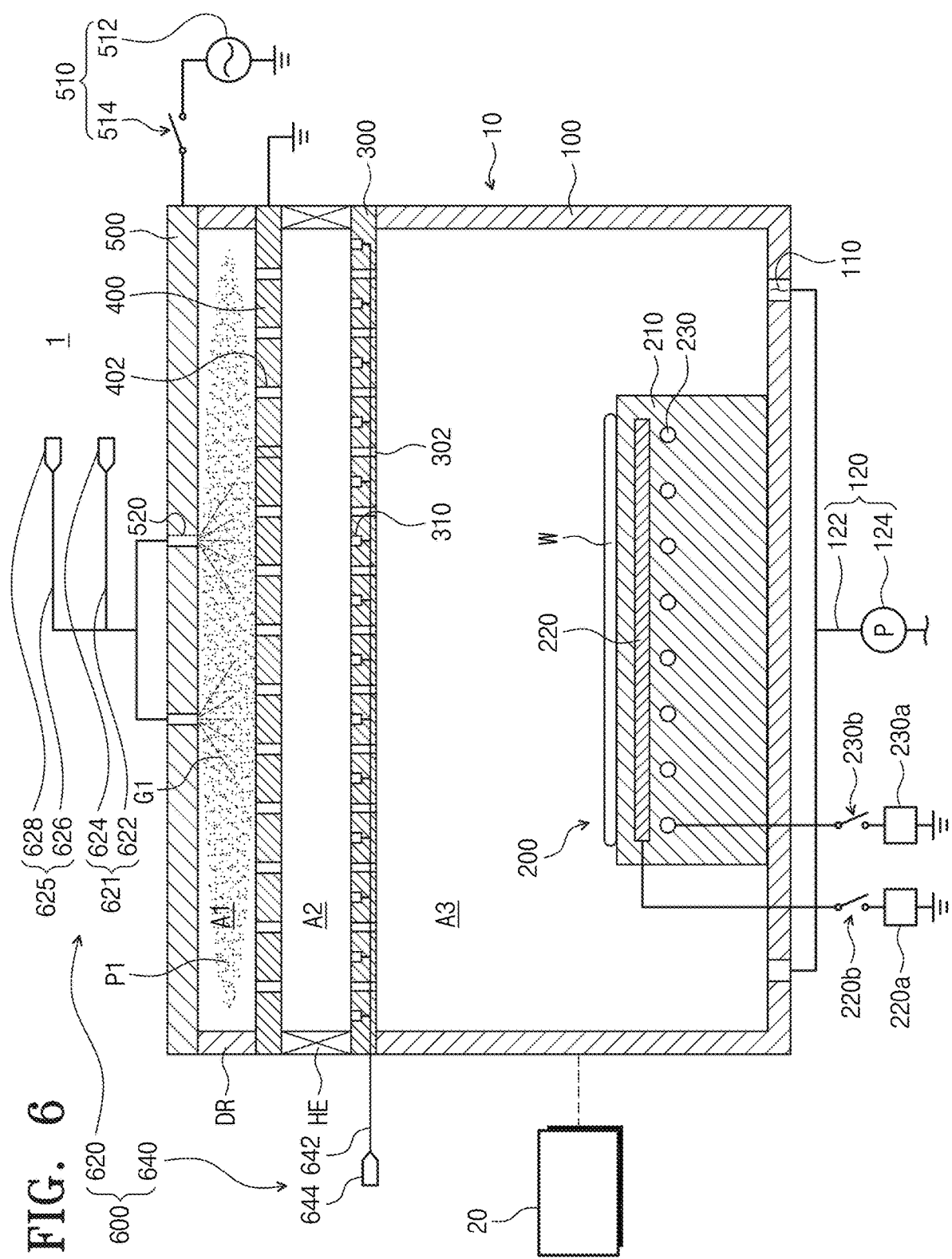
FIG. 6 is a diagram illustrating a state in which first plasma is generated by exciting first gas supplied to the first space in the first treatment operation of FIG. 4.
Figure 7:
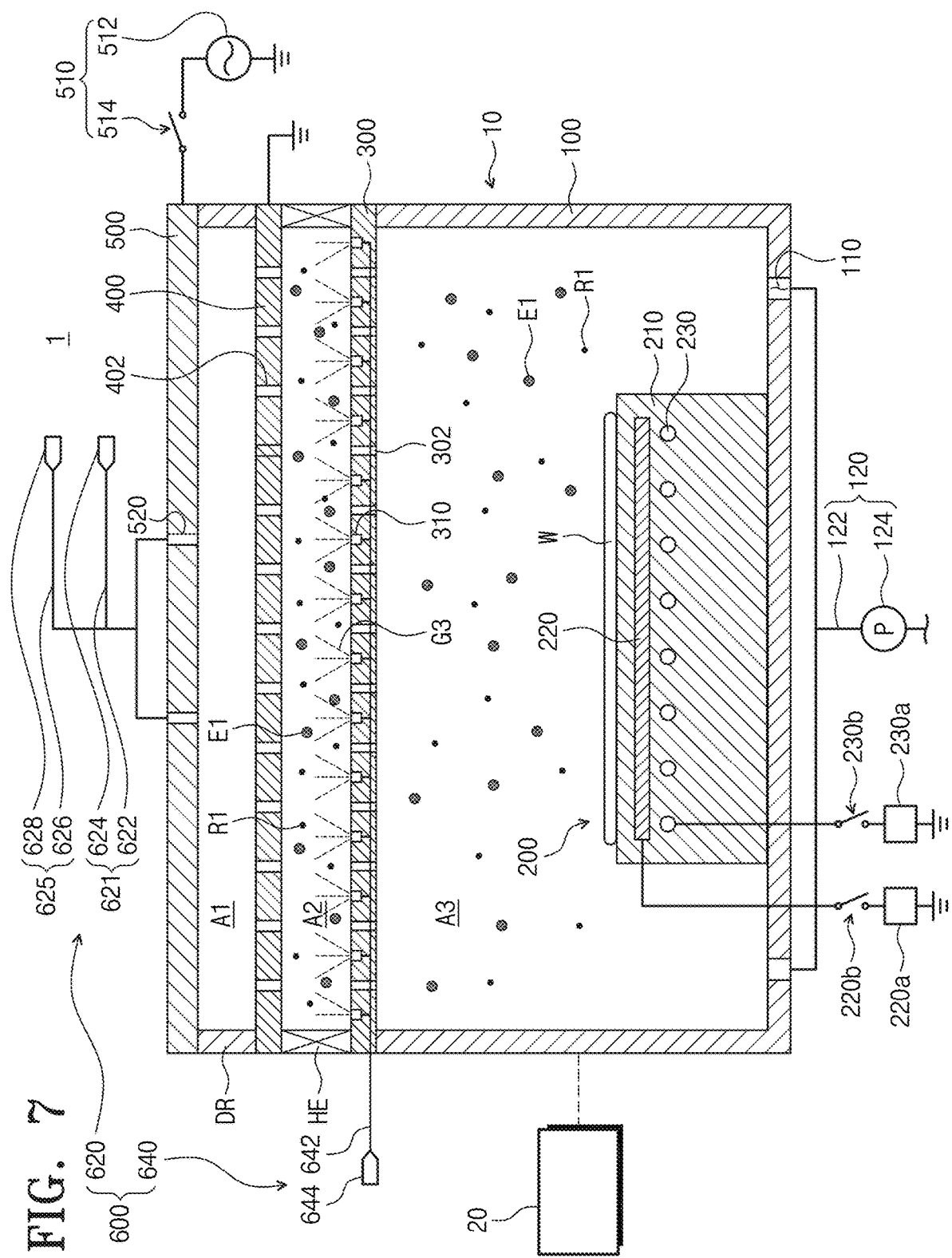
FIG. 7 is a diagram schematically illustrating a state in which a first etchant is generated by reacting third gas supplied to the second space with a first radical in the first treatment operation of FIG. 4.
Figure 8:
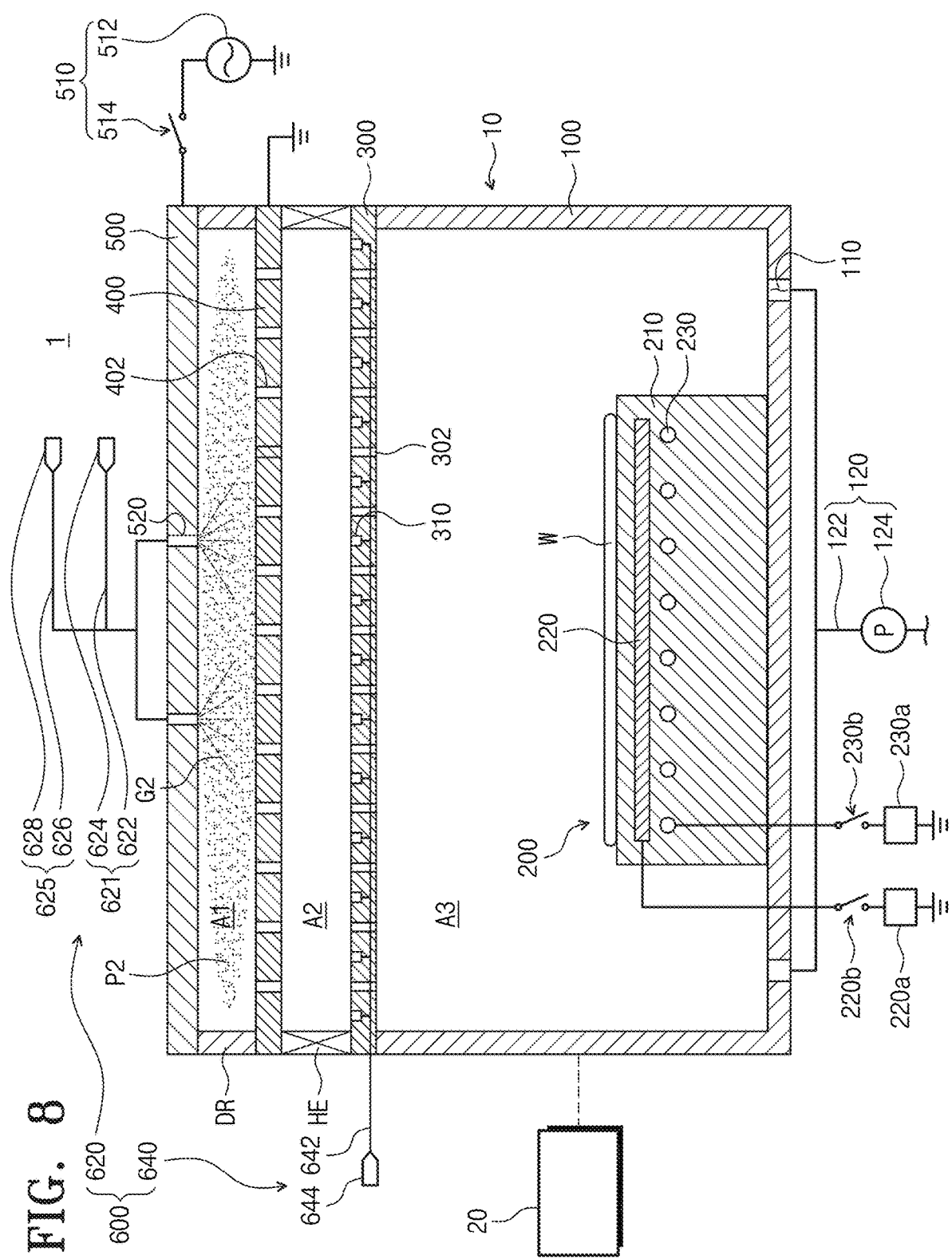
FIG. 8 is a diagram illustrating a state in which second plasma is generated by exciting second gas supplied to the first space in the second treatment operation of FIG. 4.
Figure 9:
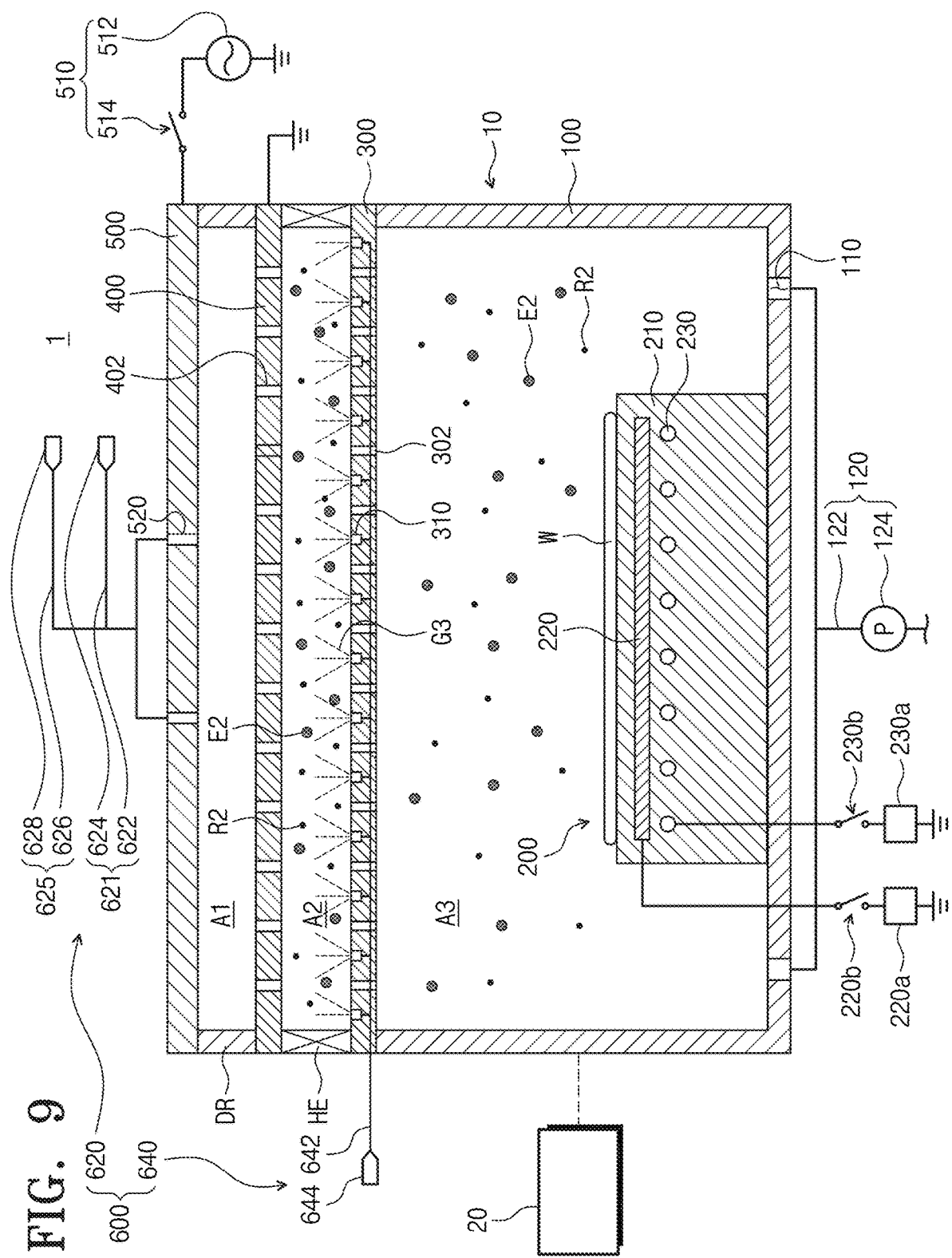
FIG. 9 is a diagram schematically illustrating a state in which a second etchant is generated by reacting third gas supplied to the second space with a second radical in the second treatment operation of FIG. 4.

FIG. 5 is a diagram schematically illustrating types of gas supplied to the first space and the second space in the first treatment operation and the second treatment operation of FIG. 4. FIG. 6 is a diagram illustrating a state in which first plasma is generated by exciting first gas supplied to the first space in the first treatment operation of FIG. 4. FIG. 7 is a diagram schematically illustrating a state in which a first etchant is generated by reacting third gas supplied to the second space with a first radical in the first treatment operation of FIG. 4. FIG. 8 is a diagram illustrating a state in which second plasma is generated by exciting second gas supplied to the first space in the second treatment operation of FIG. 4. FIG. 9 is a diagram schematically illustrating a state in which a second etchant is generated by reacting third gas supplied to the second space with a second radical in the second treatment operation of FIG. 4.

Hereinafter, the treatment operation S20 according to the exemplary embodiment of the present invention will be described in detail with reference to FIGS. 5 to 9. In the treatment operation S20, the substrate W may be treated by supplying the etchant E onto the substrate W. The treatment operation S20 may include a first treatment operation S22 and a second treatment operation S24.

In the first treatment operation S22, the substrate W may be treated by supplying the first etchant E1 on the substrate W. For example, in the first treatment operation S22, the first etchant E1 may be supplied onto the substrate W to improve the modification of the film formed on the substrate W.

As illustrated in FIGS. 5 and 6, in the first treatment operation S22, the first gas supply source 621 may supply the first gas G1 to the first space A1. For example, the first gas G1 supplied to the first space A1 in the first treatment operation S22 may be gas including ammonia ($NH_3$). The ammonia gas ($NH_3$) supplied to the first space A1 is excited into the first plasma P1 by the upper electrode 500 to which the high frequency power is applied and the grounded ion blocker 400. That is, as the first gas G1 is transited to the first plasma P1 state, the first gas is decomposed into ions, electrons, and radicals. For example, as the ammonia gas ($NH_3$) is transited to the first plasma P1 state, a first radical R1 may be generated in the first space A1. For example, the first radical R1 generated in the first space A1 may be an ammonia radical $NH_3^*$.

The first plasma P1 generated in the first space A1 flows into the second space A2 through the hole 402 formed in the grounded ion blocker 400. In the process in which the first plasma P1 passes through the hole 402, the ions and electrons among the ingredients of the first plasma P1 are absorbed. As the first plasma P1 passes through the ion blocker 400, only the radicals among ions, electrons, and radicals included in the first plasma P1 may be supplied to the second space A2. Accordingly, as illustrated in FIG. 7, only ammonia radicals ($NH_3^*$) may be supplied to the second space A2.

Also, in the first treatment operation S22, the treatment gas supply unit 640 may supply the third gas G3 to the second space A2. For example, the third gas G3 supplied to the second space A2 in the first treatment operation S22 may be gas including ammonia ($NH_3$).

Some ingredients of the ammonia radicals ($NH_3^*$) supplied to the second space A2 may react with the third gas G3 supplied to the second space A2. For example, the ammonia gas ($NH_3$) supplied to the second space A2 reacts with the ammonia radical ($NH_3^*$) flowing through the second space A2 to generate the first etchant E1. The first etchant E1 generated in the second space A2 flows from the second space A2 to the third space A3. In addition, some other ingredients of the ammonia radicals ($NH_3^*$) supplied to the second space A2 flow from the second space A2 to the third space A3.

The ammonia radical ($NH_3^*$) and/or the first etchant E1 supplied to the third space A3 may act on the substrate W positioned in the third space A3. The ammonia radicals ($NH_3^*$) and/or the first etchant E1 may be attached to the film formed on the substrate W. For example, ammonia radicals ($NH_3^*$) may be easily attached to the surface of the substrate W. Ammonia radicals ($NH_3^*$) attached to the surface of the substrate W may attract a second etchant E2 to be described later. For example, ammonia radicals ($NH_3^*$) attached to the surface of the substrate W may attract the second etchant E2 at a position where an oxide film (for example, $SiO_2$) is formed on the surface of the substrate W. The second etchant E2 attracted by the first etchant E1 may etch the oxide film. Accordingly, the first treatment operation S22 contributes so that the second etchant E2 may easily react with the oxide film formed on the substrate W. Accordingly, the first treatment operation S22 contributes to the improvement of the surface film quality of the substrate W to adjust the etching degree of the films formed on the substrate W. That is, in the first treatment operation S22, the selectivity required in various processes for treating the substrate W may be adjusted.

In the second treatment operation S24, the substrate W may be treated by supplying the second etchant E2 onto the substrate W. For example, in the second treatment operation S24, the film formed on the substrate W may be etched by supplying the second etchant E2 onto the substrate W. The second treatment operation S24 may be performed after the first treatment operation S22 is completed.

As illustrated in FIGS. 5 and 8, in the second treatment operation S24, the second gas supply source 625 may supply the second gas G2 to the first space A1. For example, the second gas G2 supplied to the first space A1 in the second treatment operation S24 may be gas containing nitrogen trifluoride ($NF_3$). The nitrogen trifluoride gas $NF_3$ supplied to the first space A1 is excited into the second plasma P2 by the upper electrode 500 to which the high frequency power is applied and the grounded ion blocker 400. That is, as the second gas G2 is transited to the second plasma P2 state, the second gas G2 is decomposed into ions, electrons, and radicals. For example, as the nitrogen trifluoride gas ($NF_3$) is transited to the second plasma P2 state, a second radical R2 may be generated in the first space A1. For example, the second radical R2 generated in the first space A1 may be a fluorine radical ($F^*$).

The second plasma P2 generated in the first space A1 flows into the second space A2 through the hole 402 formed in the grounded ion blocker 400. In the process in which the second plasma P2 passes through the hole 402, ions and electrons among the ingredients of the second plasma P2 are absorbed. As the second plasma P2 passes through the ion blocker 400, only radicals among ions, electrons, and radicals included in the second plasma P2 may be supplied to the second space A2. Accordingly, as illustrated in FIG. 9, only fluorine radicals ($F^*$) may be supplied to the second space A2.

Also, in the second treatment operation S24, the treatment gas supply unit 640 may supply the third gas G3 to the second space A2. For example, the third gas G3 supplied to the second space A2 in the second treatment operation S24 may be gas including ammonia ($NH_3$).

Some ingredients of the fluorine radicals ($F^*$) supplied to the second space A2 may react with the third gas G3 supplied to the second space A2. For example, the ammonia gas ($NH_3$) supplied to the second space A2 reacts with and the fluorine radical ($F^*$) flowing the second space A2 to generate the second etchant E2. The second etchant E2 may be ammonium fluoride ($NH_4F$). Optionally, the second etchant E2 may be ammonium hydrogen fluoride ($NH_4F \cdot HF$). The second etchant E2 generated in the second space A2 flows from the second space A2 to the third space A3. In addition, some other ingredients of the fluorine radicals ($F^*$) supplied to the second space A2 flow from the second space A2 to the third space A3.

The fluorine radicals ($F^*$) and/or the second etchant E2 supplied to the third space A3 may act on the substrate W positioned in the third space A3. For example, the second etchant E2 (for example, $NH_4F$) supplied to the third space A3 may react with a silicon oxide film (for example, $SiO_2$) formed on the substrate W to generate a reactant of $(NH_4)_2SiF_6$. The generated reactant may be removed from the substrate W. Accordingly, the second etchant E2 supplied to the third space A3 may act on a specific film formed on the substrate W to remove the specific film from the substrate W.

Referring back to FIG. 4, in the exhaust operation S30, the atmosphere inside the chamber 10 may be exhausted. For example, in the exhaust operation S30, the atmosphere of the inner space of the chamber 10 may be discharged to the outside of the chamber 10 by using the exhaust unit 120. In addition, in the exhaust operation S30, a process by-product (for example, $(NH_4)_2SiF_6$) generated in the third space A3 during the treatment operation S20 may be discharged to the outside of the chamber 10.

According to the above-described exemplary embodiment of the present invention, before the second etchant E2 acts on the substrate W and the specific film (for example, an oxide film) formed on the substrate W is etched in the second treatment operation S24, the surface film quality of the substrate W is improved, so that the second etchant E2 may effectively act on the specific film formed on the substrate in the first treatment operation S22. Specifically, ammonia radicals (NH$_3$*) attached to the surface of the substrate W in the first treatment operation S22 may attract the second etchant E2 generated in the second treatment operation S24. The second etchant E2 attracted by the ammonia radical (NH$_3$*) generated in the first treatment operation S22 may react with the oxide film on the substrate W to easily remove the oxide film formed on the substrate W.

Accordingly, according to the exemplary embodiment of the present invention, the surface film quality of the substrate W is improved before a specific film (for example, an oxide film) formed on the substrate W is removed, thereby more easily removing the specific film (for example, the oxide film) formed on the substrate W. Accordingly, the selectivity required in various processes for treating the substrate W may be efficiently adjusted.

In the above example, it has been described as an example that the second treatment operation S24 is performed after the first treatment operation S22 is completed. However, the present invention is not limited thereto, and the first treatment operation S22 and the second treatment operation S24 may be simultaneously performed. For example, the first gas G1 and the second gas G2 are simultaneously supplied to the first space A1 to simultaneously generate the first plasma P1 and the second plasma P2 in the first space A1.

Figure 10:
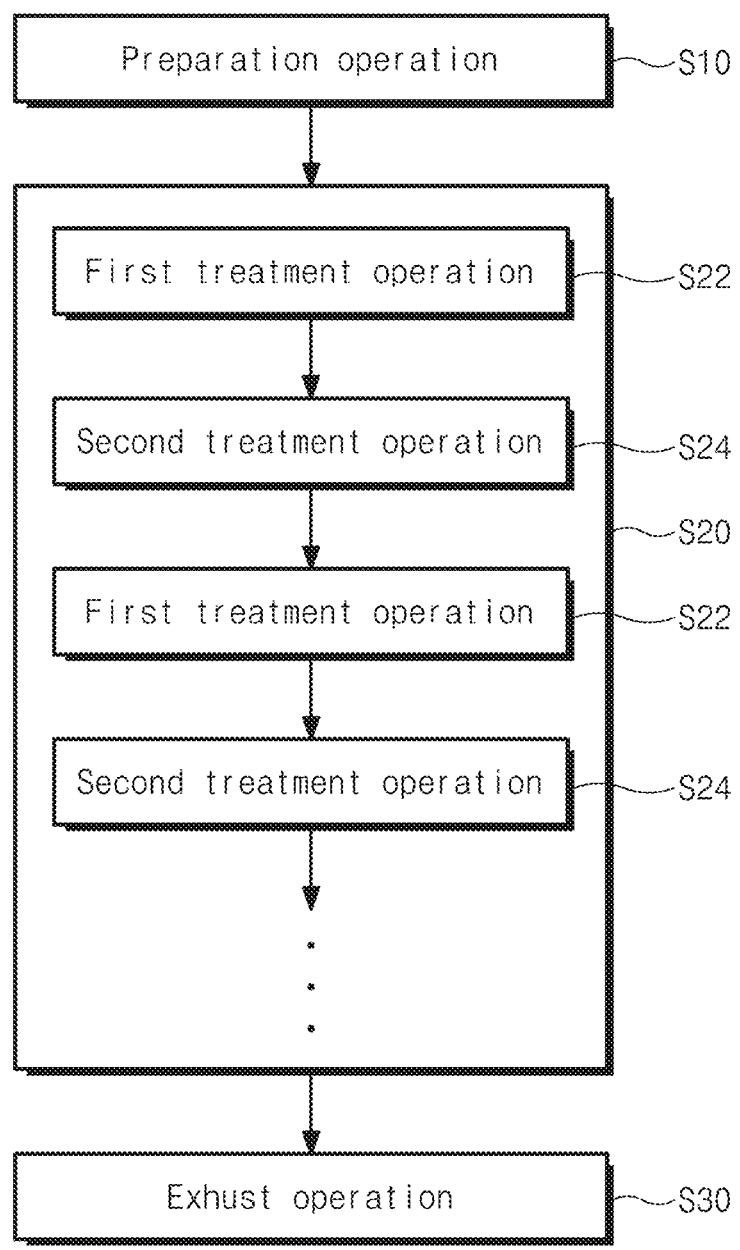
FIG. 10 is a flowchart illustrating a substrate treating method according to another exemplary embodiment of the present invention.

FIG. 10 is a flowchart illustrating a substrate treating method according to another exemplary embodiment of the present invention. Referring to FIG. 10, in the substrate treating method according to the exemplary embodiment of the present invention, a first treatment operation S22 and a second treatment operation S24 are sequentially performed, and the first treatment operation S22 and the second treatment operation S24 may be repeatedly performed alternately with each other. According to one example, after the preparation operation S10 is completed, the first treatment operation S22 and the second treatment operation S24 may be sequentially performed, and then subsequently, the first treatment operation S22 and the second treatment operation S24 may be repeatedly performed. The number of repetitions of the first treatment operation S22 and the second treatment operation S24 described in the present invention may be performed a plurality of times. According to the exemplary embodiment of the present invention, a specific film (for example, an oxide film (SiO$_2$)) formed on the substrate W may be more efficiently removed by repeatedly and alternately performing the first treatment operation S22 and the second treatment operation S24.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating method, comprising:
   a first treatment operation of treating the substrate by using first plasma generated by exciting a first gas; and
   a second treatment operation of treating the substrate by using second plasma generated by exciting a second gas different from the first gas,
   wherein the first treatment operation includes
      generating the first plasma in a first space within a chamber,
      removing ions included in the first plasma and supplying an ammonia radical to a second space while the first plasma flows from the first space to the second space located below the first space,
      generating a first etchant in the second space, by reacting the ammonia radical and a third gas containing hydrogen, and
      supplying the first etchant to a third space in which the substrate is placed, and
   wherein the second treatment operation includes
      generating the second plasma in the first space,
      blocking ions included in the second plasma from being supplied to the second space and supplying a fluorine radical to the second space, while the second plasma flows from the first space to the second space,
      generating a second etchant in the second space by reacting the fluorine radical and the third gas containing hydrogen, and
      supplying the second etchant to the third space in which the substrate is placed.

2. The substrate treating method of claim 1, wherein the second treatment operation is performed after the first treatment operation.

3. The substrate treating method of claim 1, wherein the first treatment operation and the second treatment operation are alternately performed.

4. The substrate treating method of claim 1, wherein
   the first gas excited into the first plasma contains hydrogen, and
   the second gas excited into the second plasma contains fluorine.

5. The substrate treating method of claim 4, wherein
   the first gas contains ammonia (NH$_3$), and
   the second gas contains nitrogen trifluoride (NF$_3$).

6. The substrate treating method of claim 5, wherein in the first treatment operation,
   the first plasma is generated in the first space within a chamber,
   the ions included in the first plasma are removed and the ammonia radical is supplied to the second space while the first plasma flows from the first space to a second space located below the first space, and
   the ammonia radical is supplied to the third space on which the substrate is placed.

7. A substrate treating method of treating a substrate in a chamber divided into a first space, a second space, and a third space, the substrate treating method comprising:
   generating plasma by supplying a process gas in the first space, and
   generating an etchant by reacting the plasma and a treatment gas in the second space located below the first space,
   treating the substrate in the third space using the etchant, the third space located below the second space,
   wherein the process gas includes a first gas and a second gas different from the first gas, and
   wherein the generating of the plasma includes
      generating first plasma by supplying the first gas to the first space, and
      generating second plasma by supplying the second gas to the first space, wherein the generating of the etchant includes
- removing ions included in the first plasma and supplying an ammonia radical to the second space while the first plasma flows from the first space to the second space located below the first space,
- generating a first etchant in the second space, by reacting the ammonia radical and a third gas containing hydrogen,
- supplying the first etchant to the third space in which the substrate is placed,
- blocking ions included in the second plasma from being supplied to the second space and supplying a fluorine radical to the second space, while the second plasma flows from the first space to the second space,
- generating a second etchant in the second space by reacting the fluorine radical and the third gas containing hydrogen, and
- supplying the second etchant to the third space in which the substrate is placed.

8. The substrate treating method of claim 7, wherein the first gas and the second gas are alternately supplied to the first space.

9. The substrate treating method of claim 8, wherein the first gas contains ammonia ($NH_3$), and the second gas contains nitrogen trifluoride ($NF_3$).

10. The substrate treating method of claim 9, wherein
the first space and the second space are partitioned by a grounded plate,
the ions included in the first plasma generated by the first gas supplied to the first space are blocked by the grounded plate, so that the ammonia radical is supplied to the second space, and
the ions included in the second plasma generated by the second gas supplied to the first space are blocked by the grounded plate, so that the fluorine radical is supplied to the second space.

11. The substrate treating method of claim 7, wherein the treatment gas includes ammonia ($NH_3$).

12. The substrate treating method of claim 11, wherein the treatment gas is continuously supplied to the second space while the first gas and/or the second gas is supplied to the first space.

13. The substrate treating method of claim 7, wherein the first gas and the second gas are simultaneously supplied to the first space.

* * * * *